United States Patent
Legoues et al.

[11] Patent Number: 5,810,924
[45] Date of Patent: Sep. 22, 1998

[54] LOW DEFECT DENSITY/ARBITRARY LATTICE CONSTANT HETEROEPITAXIAL LAYERS

[75] Inventors: Francoise Kolmer Legoues, Peekskill; Bernard Steele Meyerson, Yorktown Heights, both of N.Y.

[73] Assignee: International Business Machines Corporation, Armonk, N.Y.

[21] Appl. No.: 472,037

[22] Filed: Jun. 7, 1995

Related U.S. Application Data

[62] Division of Ser. No. 171,371, Dec. 22, 1993, abandoned, which is a continuation of Ser. No. 709,921, May 31, 1991, abandoned.

[51] Int. Cl.$^6$ .......................... H01L 21/20; H01L 21/203; H01L 21/205
[52] U.S. Cl. ...................................... 117/89; 148/DIG. 67; 148/DIG. 97
[58] Field of Search ...................... 148/DIG. 6, DIG. 72, 148/DIG. 97; 437/128, 967, 976; 117/89, 90

[56] References Cited

U.S. PATENT DOCUMENTS

| | | |
|---|---|---|
| 3,441,453 | 4/1969 | Conrad . |
| 3,493,811 | 2/1970 | Ewing . |
| 3,721,583 | 3/1973 | Blakeslee . |
| 4,963,508 | 10/1990 | Umeno . |
| 5,221,413 | 6/1993 | Brasen . |
| 5,298,452 | 3/1994 | Meyerson . |
| 5,352,912 | 10/1994 | Crabbe et al. . |

(List continued on next page.)

OTHER PUBLICATIONS

R. Hull et al., A phenomenological description of strain relaxation in Gex Si1–x /Si (100) heterostructures. J. Appl. Phys., 66, 5837 (1989).

L.B. Freund, A criterion for arrest of a threading dislocation in a strained epitaxial layer due to an interface misfit dislocation in its path, J. Appl. Phys., 68, 2073 (1990).
J.H. van der Merwe, "No Reference", J. Appl. Phys. 34, 117 (1963).
J.W. Matthews et al., "Defects in epitaxial multilayers", J. Crystal Growth, 29, 273, (1975).
B.S. Meyerson et al., "Cooperative growth phenomena in silicon/germanium low–temperture epitaxy", Appl. Phys. Lett., 53, 2555 (1988).
J.W. Matthew et al., "Defects in epitaxial multilayers", J. Crystal. Growth, 32, 265, (1976).
B.W. Dodson, "Dislocation filtering: why it works, when it doesn't", Journ. Electr. Mater. 19, 503 (1990).
R. Hull et al., Role of strained layer superlattices in misfit dislocation reduction in lgrowth of epitaxial Ge0.5 Si0.5 . . . J. appl. Phys., 65, 4723 (1989).
G.L. Patton et al., 75–GHz ft SiGe–Base Heterojunction Biopolar Transistors, Electron. Dev. Letts., 1', 171 (1990).
K. Ismail et al. "High electron mobility in modulation–doped Si/SiGe", Appl. Phys. Lett., 58, 2117 (1991).
B.S. Meyerson et al., "Bistable conditions for low–temperature silicon epitaxy", Appl. Phys. Lett., 57, 1034 (1990).
J.F. Morar et al., "Metallic CaSi2 epitaxial films on Si(111)", Phys. Rev. B, 37, 2618 (1988).

(List continued on next page.)

Primary Examiner—John Niebling
Assistant Examiner—Kevin F. Turner
Attorney, Agent, or Firm—Robert M. Trepp

[57] ABSTRACT

A multi-layered structure and process for forming it are described, incorporating a single crystal substrate, a plurality of epitaxial layers having graded composition wherein the layers have changing lattice spacings not exceeding about 2 percent per 1000 Å of thickness whereby misfit dislocations are formed to relieve strain and then move to the edges of respective layers. The invention overcomes the problem of large numbers of misfit dislocations threading to the surface of the top layer, especially during device processing at temperatures in a range from 700 to 900 degrees Celsius. Fully relaxed, incommensurate structures having low defect densities are obtained, where arbitrary combinations of materials can be used.

20 Claims, 10 Drawing Sheets

U.S. PATENT DOCUMENTS

| | | |
|---|---|---|
| 3,766,447 | 10/1973 | Mason . |
| 3,821,033 | 6/1974 | Hu . |
| 3,962,716 | 6/1976 | Petroff et al. . |
| 3,963,538 | 6/1976 | Broadic . |
| 3,963,539 | 6/1976 | Kemlage . |
| 4,088,515 | 5/1978 | Blakeslee . |
| 4,177,321 | 12/1979 | Nishizawa . |
| 4,213,781 | 7/1980 | Noreika . |
| 4,486,265 | 12/1984 | Little . |
| 4,517,047 | 5/1985 | Chang et al. ............. 156/610 |
| 4,548,658 | 10/1985 | Cook . |
| 4,636,401 | 1/1987 | Yamazaki et al. . |
| 4,769,341 | 9/1988 | Luryi . |
| 4,900,372 | 2/1990 | Lee . |
| 4,959,245 | 9/1990 | Dobson . |

OTHER PUBLICATIONS

J.M. Cowley, "No Reference" in Advances in Electronics and Electron Physics, 46, 1 (1978).

D.J. Eaglesham et al., "Dislocation nucleation near the critical thickness in GeSi/Si strained layers", Phil. Mag., 59, 1059 (1989).

F.K. LeGoues et al. "Novel strain–induced defect in thin molecular–beam epitaxy layers", Phys. Rev. Lett., 63, 1826 (1989).

R. Hull et al., "Activation barriers to strain relaxation in lattice–mismatched epitaxy", Physical Review B, 40 (3), 1681 (1989).

Kasper et al., "Very Low Temperature MBE Process for SiGe and Si Device Structures", Tech. Digest of the Int'l Electron Devices Mtg, 14 Dec. 1988, San Francisco, CA, US, pp. 558–561.

Osbourn et al., "A $GaAs_xP_{1-x}$/GaP Strained–layer Superlattice", Appl. Phys. Lett, 41, 172 (1982).

Von Kanel et al., "Epitaxy of Metal Silicide", vol. 184, No. 1, Jan. 1990, Lausanne, CH. pp. 295–297.

LOW DEFECT DENSITY/ARBITRARY LATTICE CONSTANT HETEROEPITAXIAL LAYERS

This is a divisional of application Ser. No. 08/171,371, filed Dec. 22, 1993, now abandoned, which is a continuation of application Ser. No. 07/709,921, filed May 31, 1991, now abandoned.

BACKGROUND OF THE INVENTION

1. Field of the Invention

This invention relates to structures including layers of materials which are not lattice matched but which can be combined in layered structures wherein the final layer is fully relaxed and exhibits sufficiently low defect densities to be useful for device applications, either as a device-bearing layer or as a substrate for a device-bearing layer. More particularly, this invention relates to such structures and to processes for making them, an especially interesting example being a fully relaxed structure including a silicon substrate, and a Si:Ge layer of graded composition formed on the silicon substrate, and having a final composition including up to 100% Ge where the surface region of the SiGe (or Ge) layer can be used for the formation of devices therein or as a substrate layer for additional epitaxy.

2. Description of the Prior Art

In materials science, and particularly in the field of microelectronics, it is often the situation that layered structures are formed. If there is substantial lattice matching between the substrate and the layer to be formed thereon, various thicknesses of layers can be formed which will be fully relaxed and exhibit low defect densities. In this context, low defect densities are defined as those densities which make the layer suitable for use in devices, i.e., suitable for use either as a substrate for a device-containing layer formed thereon, or suitable for the formation of devices therein.

As an example of an epitaxial structure of the type described in the previous paragraph, it is well known to deposit epitaxial layers of either n or p type silicon on an underlying silicon substrate, where the lattice matching is such that varying thicknesses of epitaxial layers can be formed. In contrast with this situation, however, is a situation in which the substrate and the layer to be deposited thereon do not have close lattice matches. In this latter situation, epitaxy can be attempted, but there will be a critical thickness at which the strain that occurs due to the lack of lattice match will cause the nucleation of defects in the growing epitaxial layer. These defects will quickly propagate and multiply so that the resulting epitaxial film contains very high defect levels. If the thickness of the epitaxial layer is less than the critical thickness at which defect nucleation occurs, there can be a very low defect density in the epitaxial layer. However, when the maximum layer thickness must be less than the critical thickness a severe limitation can result. For example, there may be limitations on the types of devices which can be fabricated, as well as limitations on the electrical properties that can be obtained.

The critical thickness of an epitaxial layer formed on a substrate to which it is not lattice-matched depends upon the degree of mismatch between the epitaxial layer and the substrate. As the degree of mismatch increases, the critical thickness of the epitaxial layer becomes smaller. For example, Ge has about a 4% mismatch with Si. This means that, when Ge is to be epitaxially formed on Si, only about five or six atomic layers of Ge can be formed before dislocation defects occur. On the other hand, if the epitaxial layer material and the substrate material have only a very small mismatch, the epitaxial layer can be made very thick prior to the formation of dislocation defects therein.

In the formation of structures including non lattice-matched layers, it is well known that misfit dislocations will occur and that threading parts of such dislocations can propagate toward the edges of the growing epitaxial film, as the thickness of the growing film increases. However, there is a limit, termed the "glide distance", over which the threads will move toward the edges of the growing epitaxial film. At temperatures less than 600° C., gliding is slow and the glide distance is exceptionally small, mostly due to the repulsive interaction between intersecting dislocations. This results in numerous threading dislocations being pinned in the final epilayer.

In the prior art it is known that misfit dislocations can be controlled somewhat to reduce their appearance in epitaxial layers that are not lattice matched to the substrate. One such technique is the use of strained super lattice layers that are utilized to bend threading dislocations to the edge of the wafer. This is known as "dislocation filtering", and is described by Matthews et al in J. Crystal Growth, 29, 273 (1975). This technique has been used in GaAs based systems to provide some reduction in the density of threading dislocations, but does not work in SiGe systems. A publication by B. W. Dodson, J. Electrical Materials, 19, 503 (1990) reports the result of this technique to provide a $10^4$ reduction in the density of threading dislocations in GaAs based systems. Another article by R. Hull et al, appearing in J. Appl. Phys. 65, 4723 (1989) describes the use of dislocation filtering in SiGe alloy systems. As noted in this article, this filtering technique does not work to provide defect density reduction in SiGe alloy systems.

It is also known in the art to use intermediate layers between two layers which are not lattice matched, in order to provide structures having reduced defect densities. It is further known to form structures in which a layer having a graded composition is utilized between two layers which are not lattice matched. However, in both of these approaches it has not been possible to produce fully relaxed structures wherein the epitaxial layer has sufficiently low defect densities to be suitable for any useful purpose.

B. S. Myerson et al, Appl. Phys. Lett. 53, 2555 (1988) describes the formation of a series of Si:Ge alloys formed by ultra high vacuum chemical vapor deposition (UHVCVD) in which intermediate layers of pure Si are located between each Si:Ge alloy layer. These layers were formed over an initial silicon substrate, with the Ge content being increased during the formation of each Si:Ge layer until the top Si:Ge layer contained about 20% Ge. The alternating layers of pure Si were used as marker layers for later cross-sectional transmission electron microscopy (TEM). Both incommensurate (fully relaxed) structures and commensurate (strained) structures were formed. The defect density in the uppermost layer of the commensurate structures was less than about $10^4$ defects/cm², a number consistent with what would be expected for strained structures. The defect density of the uppermost layer of the incommensurate structures was not measured, the sensitivity of the instrumentation not allowing measurement to less than about $10^8$ defects/cm². It was noted in this article that the final structures had defects present in the substrate, but no mention was made of any threading mechanism for movement of dislocation defects to the edges of the wafer. In addition, no mention was made of any criticality with respect to the rate of compositional grading and strain relaxation, and the maximum Ge content in the Si:Ge layers did not exceed 20%.

It is apparent from the prior art that, until the present invention, no technique existed for the production of fully relaxed, non lattice-matched systems of arbitrary compositions having reduced defect densities, where the defect densities were reduced by substantial amounts. Further, the prior art does not teach any technique for reduction of defect densities in fully relaxed non lattice-matched systems where the technique can be applied to many different kinds of materials, indeed to a very arbitrary mix of non lattice-matched materials. Still further, the prior art does not illustrate a low temperature technique for the formation of reduced defect, incommensurate layers of diverse lattice parameters where the substrate and the final epitaxial layer can be elements, alloys or compounds, or wherein the non lattice-matched materials can be metallics, semi-conductors, insulators, superconductors, etc.

Accordingly, it is a primary object of the present invention to provide structures and processes for making these structures wherein layers of non lattice-matched materials can be formed having low defect densities in fully relaxed layered structures.

It is another object of the present invention to provide a low temperature process for forming incommensurate layered structures having sufficiently low defect densities to be useful for device applications.

It is another object of the present invention to provide incommensurate layered structures of non lattice-matched materials where the materials can be elements, alloys, or compounds.

It is another object of the present invention to provide epitaxial layered structures which combine materials of differing lattice constant in a manner to provide low defect densities.

It is another object of the present invention to provide incommensurate layered structures including non lattice-matched epitaxial layers integrating Si and GaAs-based materials.

It is another object of the present invention to provide a structure including a crystalline substrate layer, an intermediate layer of varying composition, and a third layer formed on said intermediate layer and substantially lattice-matched to said intermediate layer, where the third layer has a low defect density and is not lattice-matched to said substrate.

It is a further object of this invention to provide a structure and a process for making the structure where the structure includes a first silicon layer, a compositionally graded Si:Ge layer, and an overlying GaAs-based layer substantially lattice matched to the surface of the intermediate layer, where the GaAs-based layer having a low defect density.

It is a still further object of the present invention to provide a structure and a process for making it where the structure includes a silicon layer and a graded Si:Ge layer containing up to 100% Ge in the topmost portion of the Si:Ge layer, this topmost portion being suitable as a device layer or as a substrate layer for epitaxy thereon.

It is another object of the present invention to provide a technique for maximizing the glide distance of dislocation defects in incommensurate layered structures of non lattice-matched materials.

It is also an object of the present invention to provide a technique which modifies the nucleation of dislocation defects in a layered epitaxial structure of non lattice-matched materials, and which increases the mobility of threading segments in such a structure. It is an object of the invention to form an incommensurate layer using non-matched lattice systems, including Si and Ge, III–V, and II–VI semiconductors.

It is a further object of the invention to provide a technique which allows the provision of one material on another where the lattice matching is such that normally only stressed commensurate films can be produced with low defect densities.

It is a further object of the invention to provide fully relaxed, incommensurate films where the defects in the top layer are significantly reduced or less than or equal to $10^5$ threading dislocations per $cm^2$ over that which would be expected, i.e., $10^{12}$ per $cm^2$.

It is a further object of the invention to provide incommensurate films having low defect densities in the final or terminal layer followed by epitaxial lattice-matched film thereover, for example, GaAs on Ge on Si.

It is a further object of the invention to provide a semiconductor laser medium having a direct bandgap due to zone folding of the bandgap.

SUMMARY OF THE INVENTION

A multilayered material having a low defect top layer is described which in one sample is comprised of a single crystalline substrate of a first element having a first set of lattice parameters, a plurality of epitaxial layers of graded composition of the first element (which may be, for example, silicon) and of a second element (which may be, for example germanium) the composition of the first and second elements in a selected number of the plurality of layers selected to clange one or more lattice parameters of the epitaxial layer in a range from 0.025 to 2% per 1,000 Å of thickness, wherein misfit dislocation s in the selected number of the plurality of layers form and migrate to the respective edges of the selected layers to relieve strain whereby an incommensurate film is formed in the layer above the selected number of the plurality of layers.

The invention further provides a multilayered material having an low defect layer comprising a plurality of substantially single crystal layers of varying composition having a plurality of respective crystal lattice spacings, the respective lattice spacings changing less than 2% per 1,000 Å of layer thickness whereby misfit dislocations in the respective layers do not bunch at one crystalline plane but are spread over the thickness of the plurality of layers allowing the threading parts to move to the edges of the plurality of layers.

The invention further provides a method for forming an incommensurate film of arbitrary lattice spacing comprising the steps of selecting a First substrate of single crystal material, for example silicon, having a first set of lattice parameters and an atomically clean upper surface, forming a plurality of epitaxial layers on the clean upper surface, the step of forming including the step of varying the composition of the selected number of the plurality of epitaxial layers to change one or more lattice parameters of the selected layers less than 2% per 1,000 Å of layer thickness whereby misfit dislocations in the selected layers migrate to the respective edges of the selected layers thereby forming the incommensurate film above the selected number of the plurality of layers.

The invention further provides a semiconductor laser medium for generating coherent radiation comprising a single crystal substrate having a first set of lattice parameters, a first plurality of layers having a graded composition to provide a changing lattice parameter from one of the first set of lattice parameters to a second lattice parameter on the upper surface of the top layer, the graded composition adjusted to limit the change of the lattice parameter in the plurality of layers to less than 2% per 1,000 Å thickness, a second plurality of atomically thin layers formed on the upper surface of the top layer having alternating composition from a first element to a second element, the thickness of the second plurality of atomically thin layers selected to provide a combined composition of the first and second elements corresponding to a predetermined third lattice parameter, the third lattice parameter within one percent of the second lattice parameter, several layers of the second plurality of atomically thin layers being less than 10 atoms thick whereby zone folding of the bandgap occurs to provide a direct bandgap laser medium.

These and other objects, features and advantages will be apparent from the following more particular description of the preferred embodiments.

DESCRIPTION OF THE PREFERRED EMBODIMENTS

Figure 1:
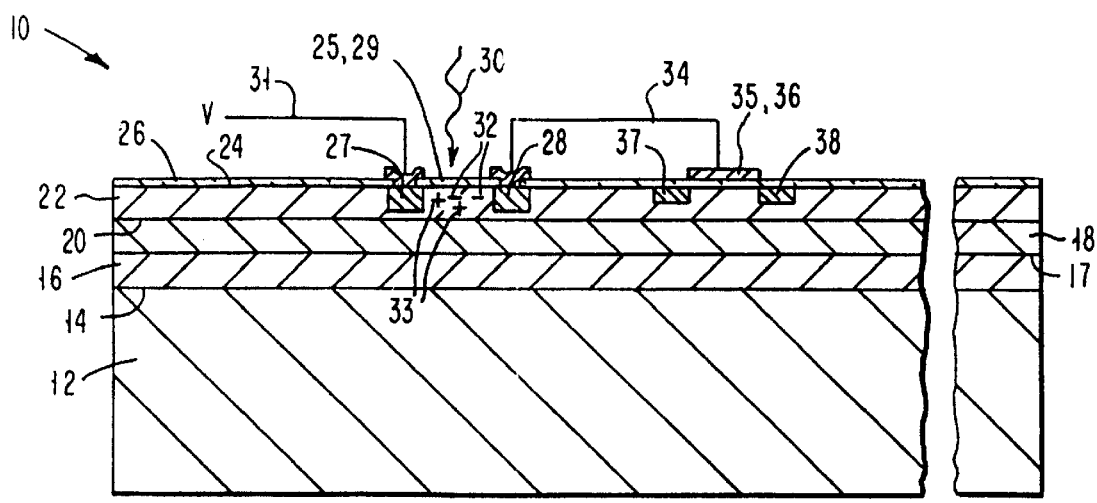
FIG. 1 is a cross section view of one embodiment of the invention.

Referring to the drawing and more particularly to FIG. 1, a multilayered material 10 is shown. Substrate 12 may be single crystalline substrate having an ultra-clean, atomically clean, atomically bare upper surface 14. Substrate 12 may be a group IV material, for example silicon, having an upper surface in the (100) plane, germanium, Si:Ge, or $Si_xC_{1-x}$ alloy, a group III–V material, for example, gallium arsenide, gallium indium arsenide, gallium indium phosphide, or indium phosphide or a group II–VI material, for example mercury cadmium telluride or cadmium telluride. Substrate 12 has a predetermined lattice spacing. A single crystal layer 16 is epitaxially formed on upper surface 14 having a lattice spacing greater than the lattice spacing of substrate 12 due to a graded composition of a first and second element to form layer 16. For example, if substrate 12 is silicon, single crystal layer 16 may be Si:Ge.

A single crystal layer 18 may be formed over upper surface 17 of single crystal layer 16. Single crystal layer 18 has a greater lattice spacing than the lattice spacing of single crystal layer 16. A single crystal layer 22 is deposited on upper surface 20 of single crystal layer 18. The lattice spacing of single crystal layer 22 is greater than the lattice spacing of single crystal layer 18. Single crystal layer 22 has an upper surface 24. The lattice spacing of single crystalline layers 16, 18 and 22 may be adjusted by adjusting the degree of germanium concentration therein. Single crystal layers 16, 18 and 22 may have a thickness in the range of about 200 to 500 Å. Single crystal layer 22 has a higher concentration of germanium than the concentration of germanium in single crystal layers 16 and 18. The germanium content from layer 16 to layer 22 may be increased by approximately 5 percent per layer up to an arbitrary percent, depending on the number of layers. The increase in lattice spacing should be less than about 2 percent per 1000 Å of layer thickness. Germanium has a lattice spacing of 4 percent larger than the lattice spacing of silicon. Thus, a graded composition of Si:Ge to get to 50 percent germanium should require a thickness of 1000 Å to increase the lattice spacing by 2 percent. However, the lattice spacing is preferably changed at a rate of 1 percent per 1000 Å. At the lattice spacing change of 1 percent per 1000 Å thickness, a graded composition of Si:Ge from 0 to 50 percent would require a thickness of 2000 Å. By depositing or forming a graded composition which results in an increasing or decreasing lattice spacing of less than or equal to 2 percent and preferably 1 percent per 1000 Å, misfit dislocations caused by the lattice mismatch are distributed more or less uniformly in the respective layers of graded composition. The graded composition in the layers and the resulting lattice spacing may be continuous or may change in steps and may go from an increase in lattice spacing to no change in lattice spacing to a decrease in lattice spacing or vice-versa. The temperature of the graded composition or layers must be raised to a temperature of at least 350° Celsius to enable misfit dislocations to nucleate and move to relieve strain. The misfit dislocations move laterally along the layers in which they were formed and move to the edges of the layers where they disappear.

Layer 22 may be 50 percent Si:Ge of arbitrary thickness, for example 2000 to 6000 Å thick. Layers 16 and 18 may have a thickness to accommodate a 2 percent and preferably a 1 percent increase in lattice spacing as the composition is graded from 0 to 50 percent germanium in a composition of Si:Ge over a substrate 12 which may be silicon.

Various devices may be formed in layer 22 in that the top layer has a low number of defects. For example, a p-i-n diode may be formed in layer 22. First, an insulating layer 26 of silicon dioxide, for example, may be formed above upper surface 24. A p region 27 and an n region 28 are formed spaced apart in single crystal layer 22 to form p-i-n diode 25. Region 29 may be without doping, or intrinsic, and generate electron-hole pairs in response to absorbing incident radiation 30 of a predetermined wavelength adjusted to the bandgap of the material in region 29 in layer 22. A voltage V may be placed on p-i-n diode 25 on p region 27 by means of lead 31 to cause a current to flow from region 27 to region 28. Electrons 32 in region 29 will be attracted to p region 27 and holes 33 in region 29 will be attracted to n region 28. Electrons will neutralize the holes in n region 28 causing n region 28 to go positive in voltage or to conduct more current. The positive voltage or current from p-i-n 25 is coupled over lead 34 to gate 35 of metal oxide semiconductor (MOS) field effect transistor (FET) 36. A doped region 37 may be the source of FET 36 and doped region 38 may be the drain of FET 36. FET 36 may provide a signal indicative of the intensity of radiation at a predetermined wavelength impinging into region 29.

Figure 2:
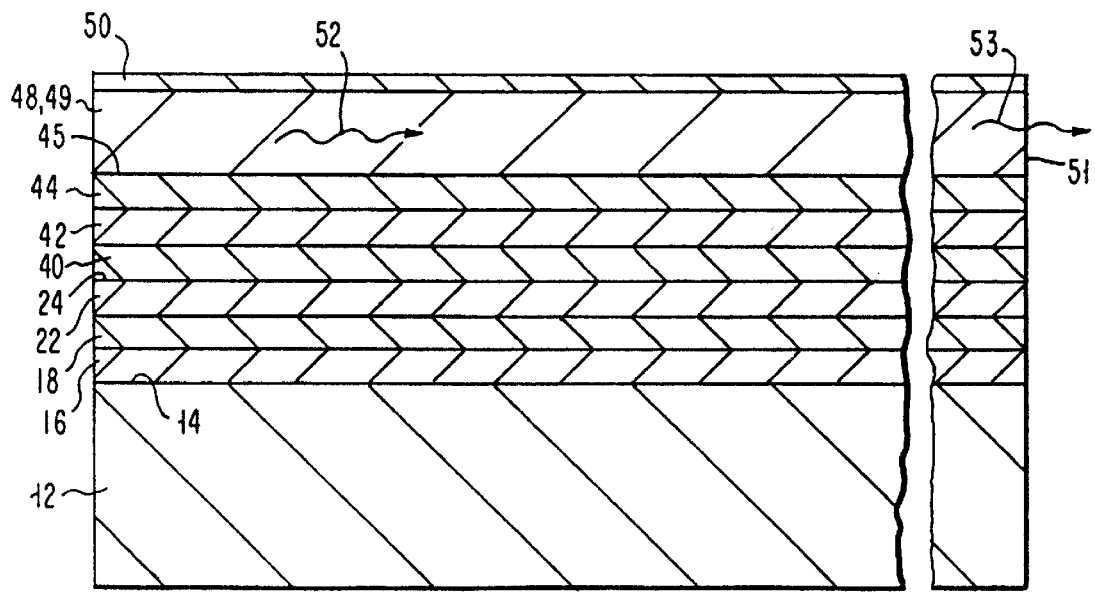
FIG. 2 is a cross section view of a first alternate embodiment of the invention.

FIG. 2 shows a cross section view of an alternate embodiment of the invention. In FIG. 2 like references are used for functions corresponding to the structure in FIG. 1. Layers 40, 42 and 44 may be single crystal layers epitaxially formed above upper surface 24. The composition of layers 40, 42 and 44 may be graded at a rate less than 2 percent per 1000 Å thickness to provide a composition of 100 percent germanium at upper surface 45 of layer 44. Layers 16, 18, 22, 40, 42 and 44 may have a total thickness of 5000 Å where the lower surface of layer 16 is 0 percent germanium and 100 percent silicon.

Substrate 12 may be silicon having an atomically clean upper surface 14 on which layer 16 is formed, for example, by either ultra high vacuum chemical vapor deposition UHV/CVD or by molecular beam epitaxy (MBE). It is understood that the upper surfaces of layers 16, 18, 22, 40, 42 and 44 are atomically clean prior to formation of the single crystal layer thereover.

The composition of the layers may be graded to have a lattice mismatch in the range from about 0.025 percent to about 2 percent per 1000 Å of thickness. Misfit dislocations in layers 16, 18, 22, 40, 42 a nd 44 nucleate and migrate to the respective edges of those layers to relieve strain due to the lattice mismatch whereby an incommensurate film is formed in the terminal layer.

A layer 48 may be epitaxially formed on upper surface 45 of layer 44 and may be, for example, gallium arsenide which is lattice matched to upper surface 45 of layer 44 of 100 percent germanium. The gallium arsenide layer 48 may be doped and have an electrode 50 to form a laser in layer 48 with current passing through layer 48 to substrate 12. The end faces 49 and 51 of layer 48 may be polished. End face 49 may be reflecting to radiant energy while end face 51 may be partially reflecting to radiant energy, shown by arrow 52, to permit a portion of the radiant energy to pass through end face 51, as illustrated by arrow 53.

Figure 3:
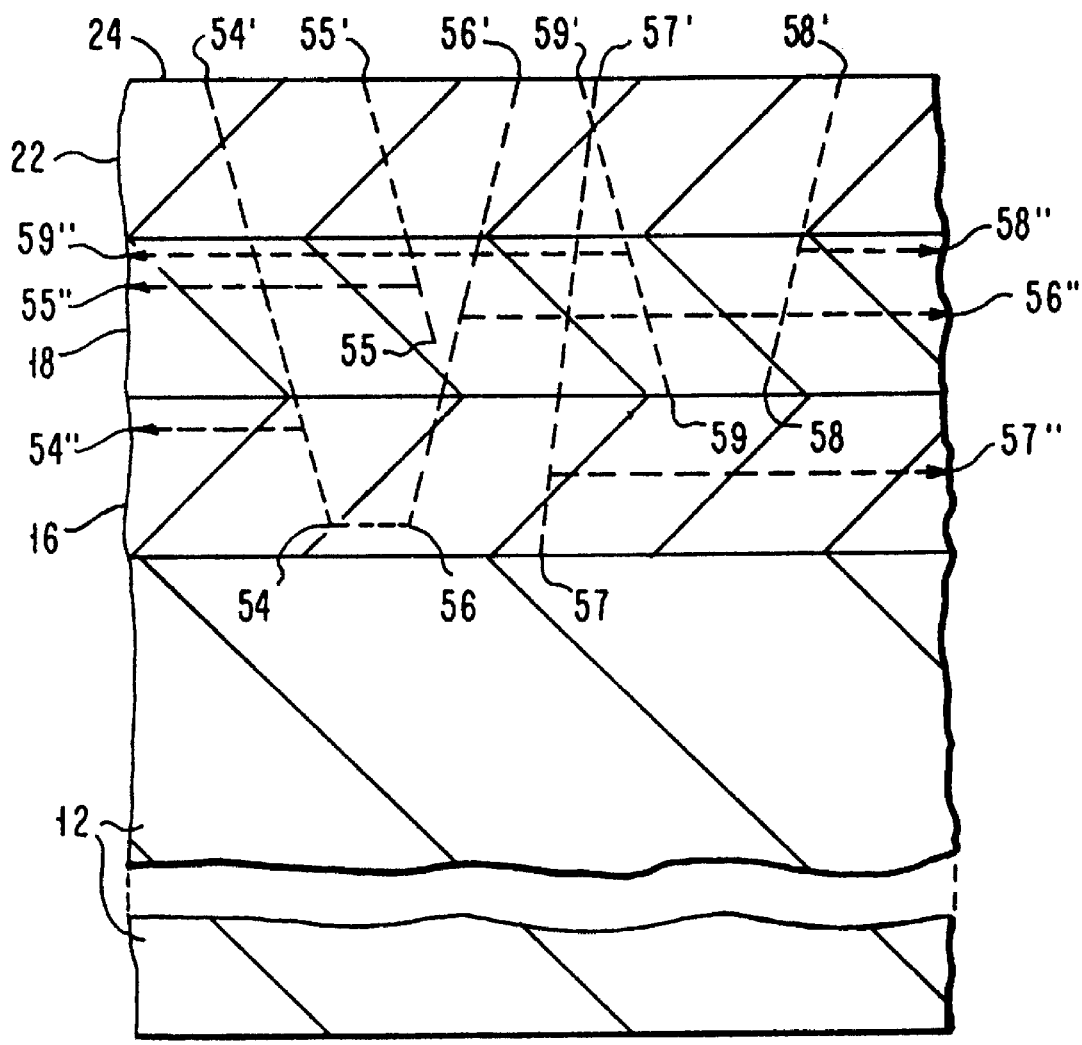
FIG. 3 is a cross section view of a multilayered structure showing the movement of misfit dislocations.

Crystalline Films having lattice mismatching provide strain relief by generating misfit dislocations when the film is thicker than the critical thickness. If lattice mismatching were greater than about 2 percent per 1000 Å the misfit dislocations would propagate up through the single crystal layer and through subsequent single crystal layers to the upper surface. FIG. 3 shows misfit dislocations 54–59 which tread their way through single crystalline layers 16, 18 and 22 to upper surface 24 the dislocations there being shown as 54'–59'. The path of a misfit dislocation from 54 to 54" is known as a threading defect. If substrate 12 and single crystal layers 16, 18 and 22 are silicon, and if lattice mismatching were greater than about 2 percent per 1000 Å, threading errors would propagate up to surface 24 and be present in an amount of about $10^{11}$ cm$^{-2}$. In FIG. 3, like references are used for functions corresponding to the structure of FIG. 1.

Referring again to FIG. 3, if single crystal substrate 12 were, for example, silicon and single crystal layer 16 were, for example, Si:Ge then layer 16 would have greater lattice spacing than the lattice spacing of substrate 12. Single crystal layer 18 may be, for example, Si:Ge having a greater lattice spacing than the lattice spacing of single crystal layer 16. Single crystal layer 22 may be, for example, Si:Ge having a greater germanium composition and having a greater lattice spacing than the lattice spacing of single crystal layer 18. If the lattice mismatch is in the range from 0.025 to 2 percent per 1000 Å of layer thickness, then the strain in layers 12, 16,18 and 22 will be substantially distributed through the layers.

The upper surface of substrate 12 will also be under compression. Misfit dislocations that occur in single crystal layer 16 will propagate upwards in single crystal layers 16 or 18 where at some point they will turn and move horizontally towards the edge of the layer and stay within layers 16 or 18. For example, misfit dislocation 54 may travel a path from 54 to 54" in place of threading upwards along the path 54 to 54'. Likewise, misfit dislocation 56 will travel upwards along a path into single crystal layer 18 from single crystal layer 16 and along the path from 56 to 56" at the edge or the layer in place of travelling up into single crystal layer 22 to surface 24. It is understood that not all misfit dislocations will travel horizontally in single crystal layer 18 and that some, though not shown, will travel to upper surface 24. However, in the present invention, the number of misfit dislocations that will pass to surface 24 will not exceed $10^5$ misfits cm$^{-2}$. Conventionally, surface 24 would have $10^{11}$ misfit cm$^{-2}$, or more. Therefore, there is a reduction or at least 6 orders of magnitude of the number of misfit dislocations on surface 24. Likewise, misfit dislocations 55, 57, 58 and 59 will travel upwards and then horizontally along the paths shown by 55", 57", 58" and 59", respectively. The misfit dislocations can be understood as planes or atoms that are added or removed from single crystal layer 18. Further, misfit dislocations which normally would thread upwards to upper surface 24 will no longer intersect one another in lower layers and pin against one another, causing the misfit dislocations to be stationary at surface 24. Thus, single crystal layer 18 may allow misfit dislocations to travel horizontally to its edge along great distances, for example, to the edge of a 12.7 cm. (five inch) diameter wafer. It is understood that the misfit dislocations move horizontally in single crystal layer 18, due to the strain induced on single crystal layer 18. The misfit dislocations in single crystal layer 18 cause a strain relieved or fully relaxed single crystal layer 22 above. Therefore, single crystal layer 22 may be of arbitrary thickness, of arbitrary germanium composition and of arbitrary band structure with of the number threading dislocations at the surface thereof being less than $10^5$cm$^{-2}$.

Figure 4:
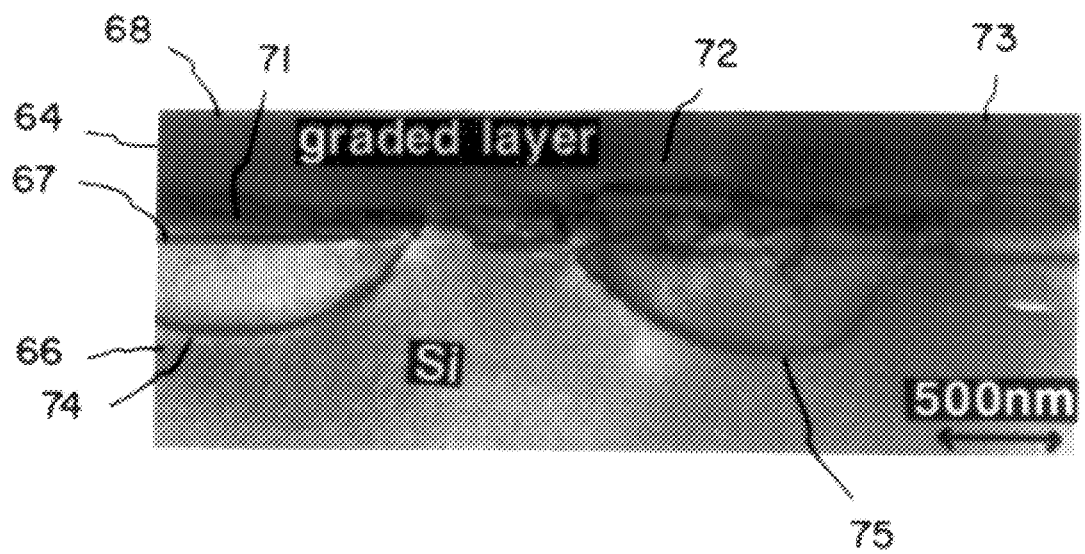
FIG. 4 is a cross section view of a second alternate embodiment of the invention.

Layer 64, shown in FIG. 4, may have a composition of the form $A_xB_{1-x}$ where A and B are elements, for example, silicon and germanium. The composition of germanium in layer 64 may vary linearly from 0 to 25 percent germanium from lower surface 67 to upper surface 68. The thickness of layer 64 is approximately 5000 Å. A 25 percent concentration of germanium with 75 percent silicon at upper surface 68 would correspond to a lattice mismatch of 1 percent with respect to lower surface 67 of 100 percent silicon. The change of lattice parameter per 1000 Å of thickness of layer 64 is 0.2 percent. The top layer or upper surface 68 of layer 64 is relaxed and incommensurate with respect to substrate 66. As shown in FIG. 4, the strain relieving defects are buried primarily in a compositionally graded buffer layer 64 and in addition some of the strain relieving dislocations are buried deep in substrate 66. In the network of dislocations as shown in FIG. 4, dislocations 71 through 73 are in layer 64 and dislocations 74 through 76 are in substrate 66. The dislocations 74 through 76 extend into layer 64. In FIG. 4, layer 64 was formed by ultra-high vacuum chemical vapor deposition (UHV-CVD) on the upper surface of substrate 66, which is silicon having an upper surface (100). It is noted that dislocations 71 through 73 are located deep in layer 64 below surface 68. Further, as shown in FIG. 4, threading defects and/or dislocations in the top portion of layer 64 are absent, leaving upper surface 68 with defects less than $10^5 cm^{-2}$.

Samples, for example layer 64 on substrate 66, were grown by both UHV-CVD and MBE at temperatures of about 550° C. Cleaning and growth procedures for forming layer 64 over substrate 66 have been described for both UHV-CVD and MBE in publications by B. S. Meyerson, et al., Appl. Phys. Lett., 57, 1034 (1990) and J. F. Morar et al., Phys. Rev. B., 37, 2618 (1988) which are incorporated herein by reference to show cleaning and growth procedures. Further, samples were prepared for both planar view and cross sectional TEM by mechanically thinning to about 30 μm, followed by ion milling to electron transparency. The observations were made at 300 kV.

The following examples will illustrate the results of this invention to form defect-free terminal layers.

EXAMPLE

Figure 5:
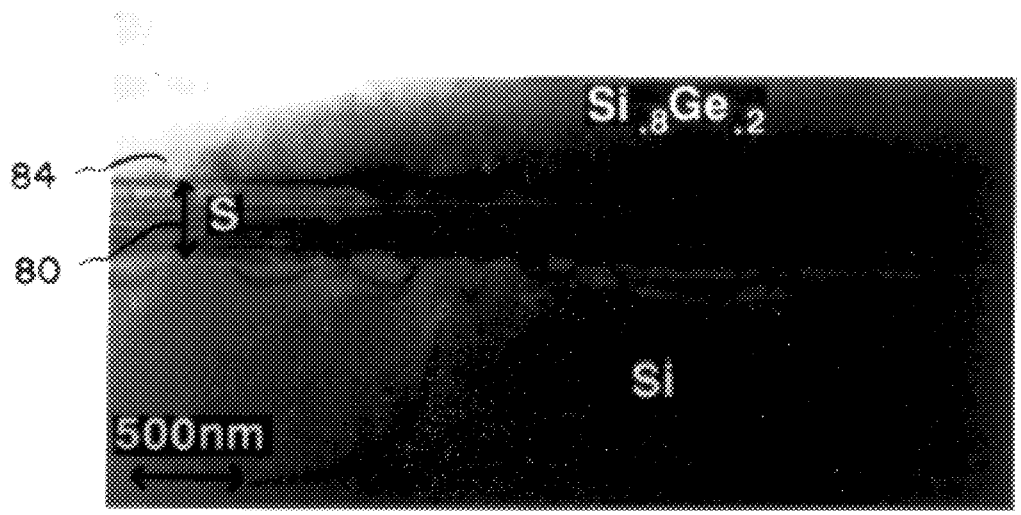
FIG. 5 is a cross section view of a third alternate embodiment of the invention.
Figure 6:
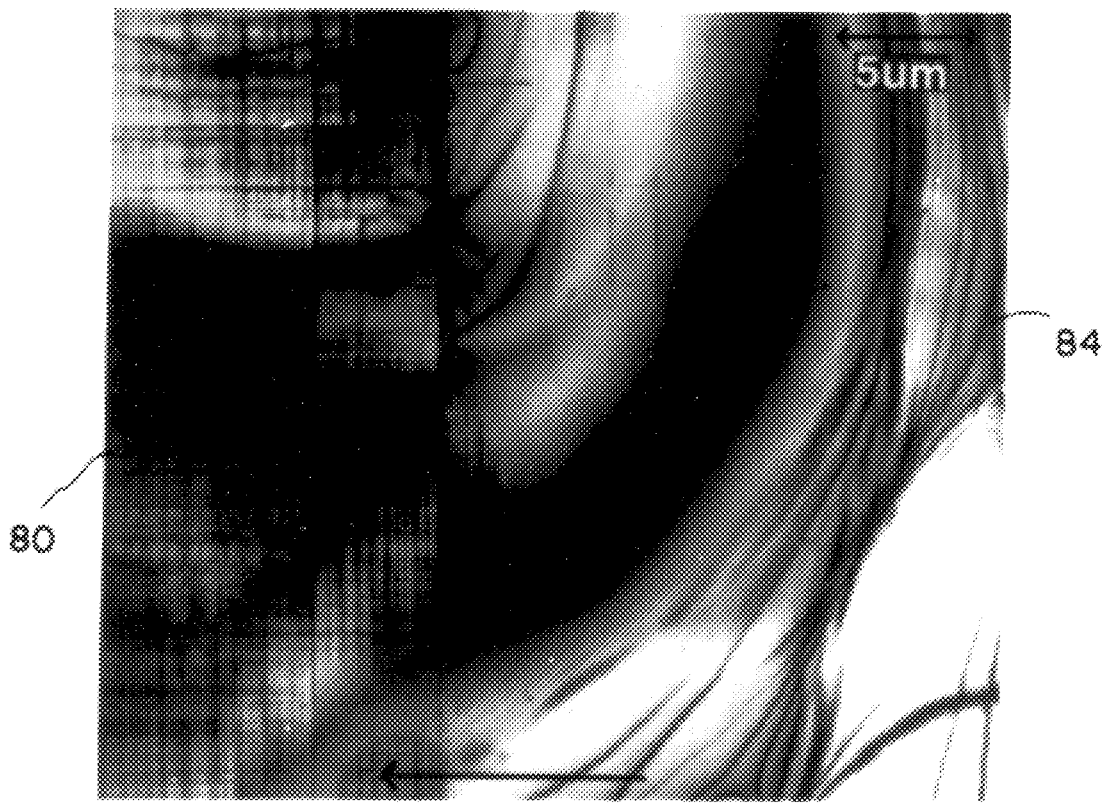
FIG. 6 is a planar TEM view of the embodiment shown in FIG. 5.

FIG. 5 is a cross sectional view of a graded superlattice 80 grown by CVD over a silicon substrate 82 having an upper surface oriented (100). The cross sectional view is along the (110) surface of substrate 82. A 4000 Å thick layer 84 containing 80 percent silicon and 20 percent germanium was formed by CVD on superlattice 80. Graded superlattice 80 consists of the following structure: 200 Å $Si_{95}Ge_5$; 50 Å Si; 200 Å $Si_{90}Ge_{10}$; 50 Å Si; $Si_{85}Ge_{15}$; 50 Å Si repeated three times; $Si_{82}Ge_{18}$, and 50 Å Si. FIG. 5 shows that layer 84 is dislocation-free. Dislocations are located in graded superlattice 80 as well as in substrate 82. Planar view TEM was also done on the sample shown in FIG. 5, in order to quantify the quality of layer 84. A reduction in excess of $10^7$ was achieved, leaving the top layer at a dislocation density below $10^5 cm^{-2}$. The planar view TEM is shown in FIG. 6. It is noted that TEM is rather insensitive to low dislocation densities, thus only upper limits of dislocations can be obtained. On the other hand etch pit measurement, which is very precise at low densities, confirmed the number of less than $10^5/cm^2$.

Figure 7:
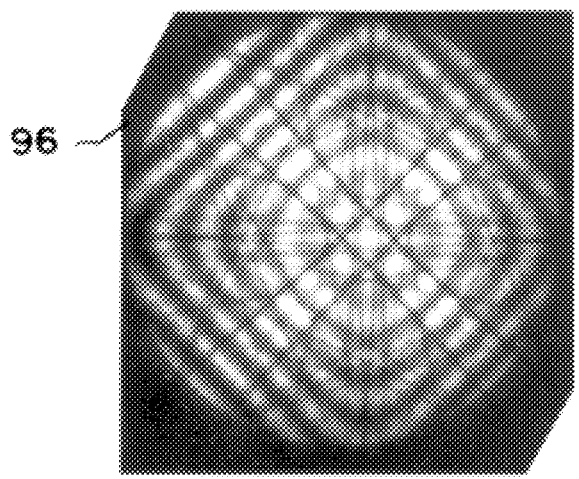
FIG. 7 is the center spot of a convergent beam diffraction pattern obtained from substrate 82.

FIG. 7 is a center spot of a convergent beam diffraction pattern obtained from silicon substrate 82, far away from graded superlattice 80. The cross section for the convergent beam diffraction pattern was along the (100) crystal plane. The cross section of substrate 82 was cooled in the microscope to about −140° C. in order to obtain a sharp convergent beam pattern.

Figure 8:
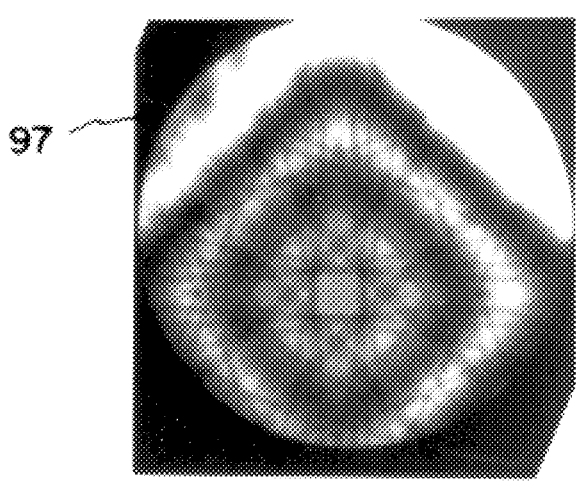
FIG. 8 is the center spot of a convergent beam diffraction pattern obtained from layer 84.

FIG. 8 is a center spot of a convergent beam diffraction pattern obtained from layer 84. The cross section was taken along the (100) crystal plane of layer 84. The cross section was cooled in the microscope to about −140° C. in order to obtain a sharp convergent beam pattern. In FIGS. 7 and 8, the beam covered an area of about 150 Å. Using the silicon lattice of substrate 82 as a reference, the lattice parameter of layer 84 can be determined to correspond to a relaxed $Si_{80}Ge_{20}$ layer or film. The relaxation can be deduced simply by noting that, even though the experimental convergent beam diffraction pattern 96, shown in FIG. 7, is qualitatively very different from pattern 97 shown in FIG. 8, the square symmetry in pattern 96 has been retained in pattern 97, indicating no tetragonal distortion in layer 84, and thus no strain within the detectability limit of the convergent beam technique. Distortions resulting in changes in the lattice parameter of 0.1% would be detectable using the convergent beam technique.

Figure 9:
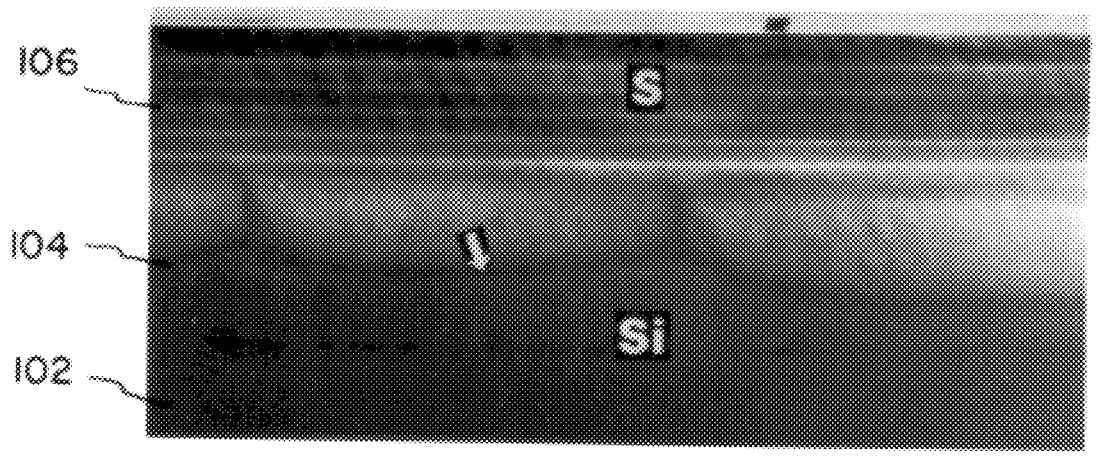
FIG. 9 is a cross section view of a fourth alternate embodiment of the invention.

FIG. 9 is a cross sectional view of substrate 102, layer 104 and graded superlattice 106. Substrate 102 is silicon and layer 104 is also silicon formed by molecular beam epitaxy (MBE). Graded superlattice 106 is formed by MBE and is free of dislocation defects. Silicon layer 104 buried particulates that appeared after extended heating of substrate 102 during cleaning. As shown in FIG. 9 similar dislocation structures result independently of how the germanium concentration is increased in graded superlattice 106, in steps or, as shown in FIG. 4, continuously in layer 64.

Figure 10:
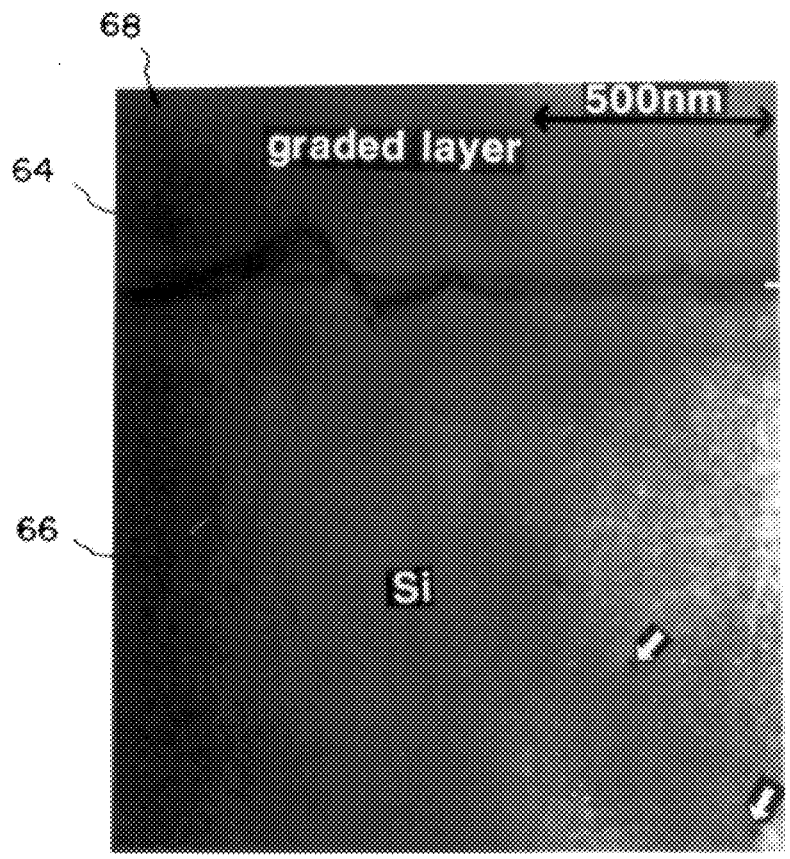
FIG. 10 is a cross section TEM view of a sample taken perpendicular to the (110) plane of the embodiment in FIG. 4.
Figure 11:
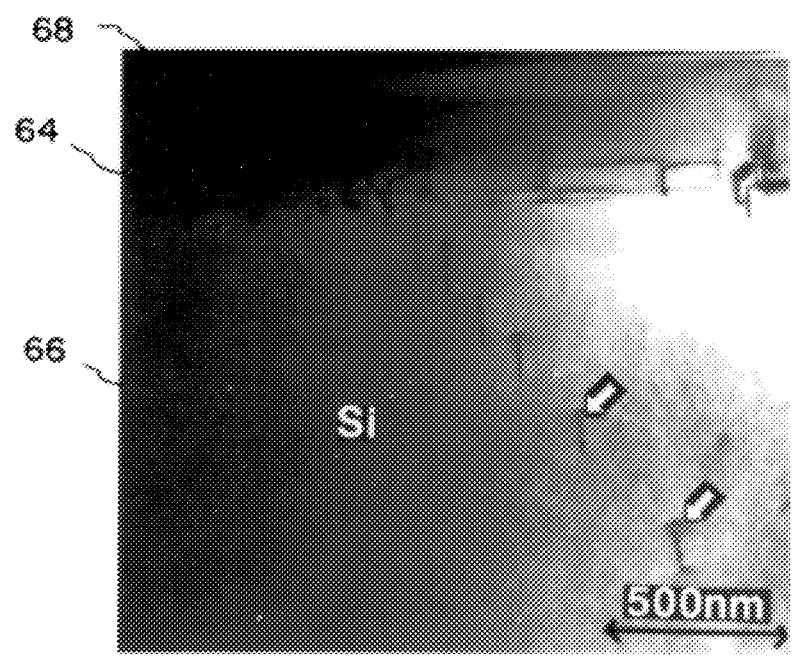
FIG. 11 is a cross section TEM view of a sample tilted 30 degrees around the [110] direction with respect to the TEM sample shown in FIG. 10.
Figure 12:
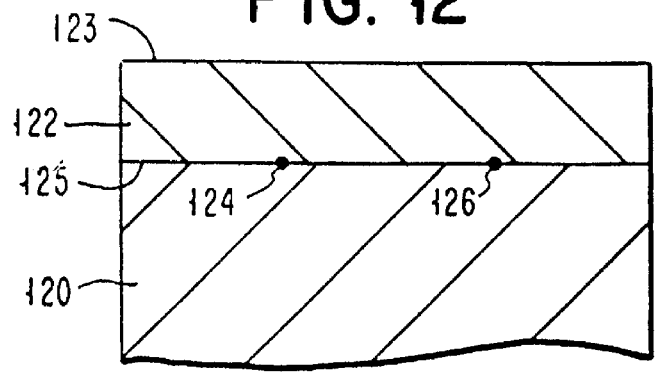
FIG. 12 is a schematic view of a segment of an interracial dislocation pinned at two nodes by intersecting dislocations.
Figure 13:
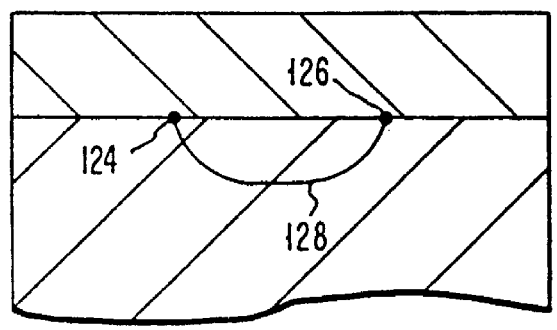
FIGS. 13–17 are schematic views of an interfacial dislocation pinned at two nodes shown in FIG. 12 operating as a Frank-Read source.
Figure 14:
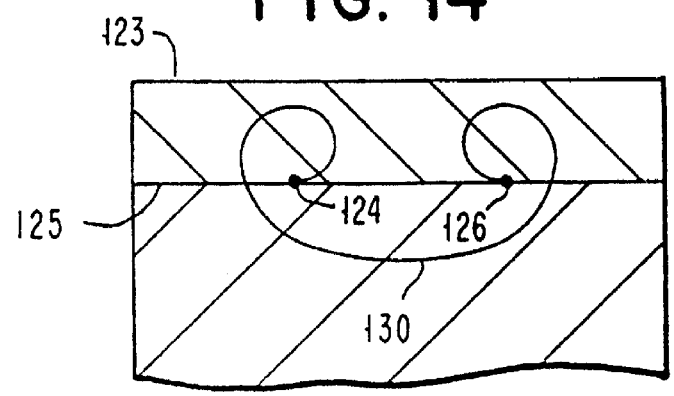

FIG. 10 is a cross section TEM sample viewed perpendicular 14 to the (110) plane of the embodiment of FIG. 4. Dislocations 110 and 112 are shown in FIG. 10 deep in substrate 66. FIG. 11 is a cross section TEM sample tilted 30° around the [110] direction compared to the TEM sample shown in FIG. 10. Dislocations 112 and 113 are shown deep in substrate 66. Dislocations 112 and 113 which had previously run parallel to the electron beam became visible as lines shown in FIG. 11. Dislocations 112 and 113 are located deep within the silicon substrate 66 and are part of a "pile-up" of dislocations which have glided along a single (111) plane. These dislocations are typical of a nucleation source located at the top of the "pile-up". A g·b vector analysis was performed to determine the Burger vector of the dislocations in a "pile-up". The analysis demonstrates that all the dislocations in one "pile-up" have the same Burger's vector, and are of the ½ (101) type, i.e., glissle on the (111) plane. The dislocations that are seen to "loop" into the silicon substrate 66 as shown in FIGS. 4 and 5 are of the same nature, but imaged in a direction perpendicular to the ones imaged here in FIGS. 10 and 11, especially dislocations 112 and 113 in the "pile-up".

A two step mechanism is proposed that explains the experimental observations: First, at a thickness significantly greater than the equilibrium critical thickness, a few dislocations are introduced, possibly as half loops from the surface, or as loops nucleated at defects in the film such as the diamond-shaped defects described by Eaglesham, et al., Phil. Mag., 59, 1059 (1989), for instance. Secondly, the network thus formed, and in particular, the nodes formed by intersecting dislocations, begin acting as Frank-Read sources, generating additional dislocations, as needed to relieve the increasing strain of the grade layer or superlattice Frank-Read dislocation sources are described in *Theory of Dislocations*, by J. P. Hirthe and J. Lothe, second edition, John Wilcy & Sons, (1982) and in a publication by R. Hull et al., Phys. Rev. B, 40, 1681 (1989). FIGS. 12–17 are a schematic of this second step. This mechanism explains the two striking features of the final microstructure, i.e., the presence of dislocations deep inside the substrate, and the lack of threading dislocations in the top layer.

The presence of dislocations deep inside the substrate is a direct consequence of the activation of Frank-Read sources as a mechanism to generate new dislocations to relieve the misfit. Consider a segment of an interfacial dislocation pinned at two nodes 124 and 126 by intersecting dislocations shown in FIG. 12 at the interface of single crystalline silicon substrate 120 and strained epitaxial Si:Ge top layer, or thin film, superlattice 122 having a different lattice parameter than the parameter in a relaxed state. It will start operating as a Frank-Read source by bowing out shown by curve 128 into substrate 120 shown in FIG. 13. It will then loop, as shown by curve 120, into the thin film 122, until it reaches the surface 123, becoming in effect a half loop as shown by curve 132 in FIGS. 14 and 15. The first half loop formed in this manner is not expected to penetrate very deeply into substrate 120, because it i s energetically rather costly to introduce dislocations into a substrate that is, for all practical purposes, not strained.

Figure 16:
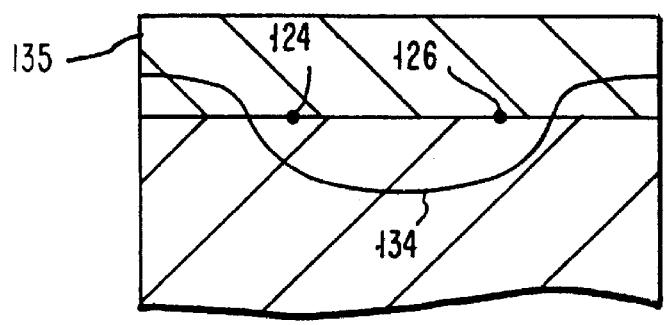

Thus, unlike the typical Frank-Read source described in the above references, this first loop 132 and 134 is expected to be very elongated along interface 125 and into thin film 122 as shown in FIGS. 16. Eventually though, as more loops 126 and 128 form, each now loop 136 and 138 will push the preceding loop 134 further down, causing the very deep, typical, pile-ups observed in FIGS. 10, 11 and 16. Careful calculations on the forces exerted on the pinned segment of the dislocations by the compressive stress in the film 122 and the nearby dislocations have to be done in order to explain the bowing of the initial dislocations into Si substrate 120.

Figure 15:
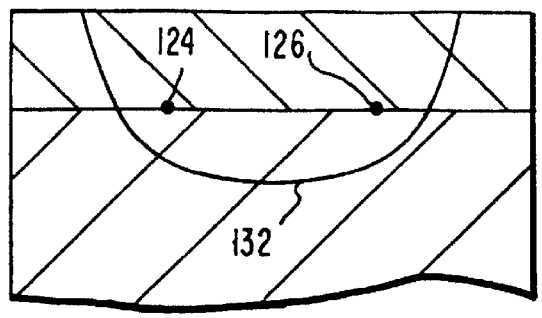

Consider now the second feature of this growth mode, i.e., the lack of threading dislocations in the top part of thin film 122: once a loop has grown large enough so that it has intersected the growth surface 123, it becomes a half loop as shown by curve 132 FIG. 15, and can start relieving the misfit in a way exactly similar to that described by Matthews and Blakeslee, J. Crystal Growth, 29, 273 (1975): each threading part of the half loop can move under the influence of the stress. The motion of these threading dislocations shown by curves 132 and 134 leaves behind misfit dislocations 124 and 126 shown in FIGS. 15 and 16. What is striking here is that at no point do the threading dislocations become pinned, which would result in the typical microstructure. One thus has to conclude that each threading segment has moved all the way to the edge 135 of thin film 122 on substrate 120. In some of the experiments described here, growth was done on 12.7 cm (5 inch) diameter wafers or substrates, so that the dislocations had to move at a rate of about 10 $\mu$m/sec, which at the growth temperature of 550° C., is several orders of magnitude faster than expected from previous measurements. It is noted that although previous experiments were done by annealing a metastably strained sample after growth, here the dislocations are moving during the growth process. The presence of growth surface 122 may considerably enhance dislocation motion, as was pointed out by R. Hull et al. ibid. Further more, the grading profile of Si:Ge significantly delays the nucleation of dislocations, thus making the driving force for motion higher once the dislocations form.

Figure 17:
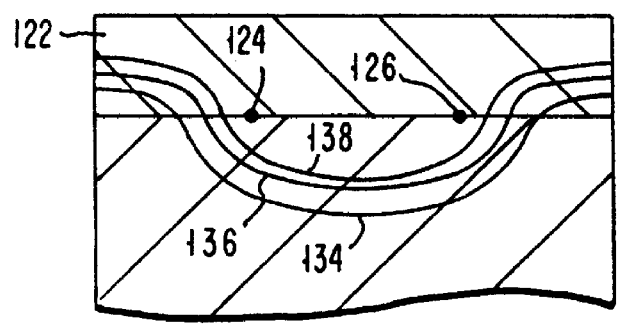

In contrast, during "normal" growth, dislocations become pinned, leaving the thin film defective. R. Hull et al, J. Appl. Phys, 66, 5837 (1989) addressed this question and showed that the repulsive force between a moving threading dislocation and a perpendicular dislocation can be enough to pin the threading part. In order for a threading dislocation to bypass a perpendicular dislocation, a certain "excess stress" needs to be applied, i.e., the film needs to be grown significantly past the equilibrium critical thickness. As presently understood, the grading of the interface helps reduce the number of threading defects in two ways: first, the initial nucleation of dislocations is retarded, possibly because it is easier to grow a perfect interface when the difference of composition between the film and substrate is small. Thus, when the initial network of dislocations is formed, there is a very high driving force for moving the threading dislocations all the way to the edge of the wafer. As additional dislocations are formed though, and the stress thus decreases, this driving force would also decrease, so that, eventually, the threading parts should become pinned. This is where the grading plays its second, most critical role: as each new dislocation loop is formed, and as each new thread moves toward the edge of the wafer, the grading provides "fresh" interfaces, with few preexisting dislocations on which a thread could become pinned. If one considers the case of a linearly graded film, each atomic layer in the thin Film needs to achieve its own lattice parameter in order to minimize the energy. Thus, in principle, one "layer" of dislocations is needed at each atomic plane, which in effect spreads the total dislocation network over the compositionally graded region as shown in FIG. 17. Consequently, at each layer, there are far fewer dislocations, and thus far fewer chances for a threading segment to become pinned by an intersecting dislocation.

This phenomenon is dependent upon the slope of the grading, i.e., there is probably a "critical slope" above which the dislocation interaction is strong enough to pin down the threads. The case of the graded superlattice is similar except that here the "grading" of the dislocation network will occur in a step-wise manner, rather than continuously. Intersecting dislocations are not the only way to pin dislocations. Particulates at the interface if not covered by a buffer layer, can play the same role and are indeed more efficient at pinning threading segments than intersecting dislocations. Similar defects, or ones such as described by Eaglesham et al, Phil. Mag., 59, 1059 (1989), may also prevent the mechanism from operating, by providing numerous low energy nucleation sites. It is evident that the Frank-Read type source described here will only operate in cases when no other nucleation sites are provided. This may explain why this phenomenon has not been observed previously.

Figure 18:
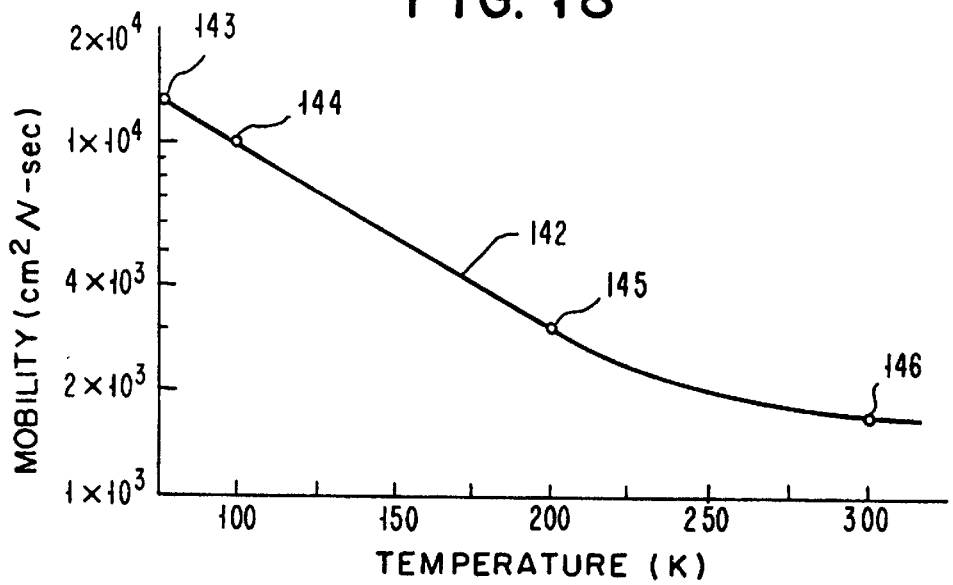
FIG. 18 is a graph of the electron mobility versus temperature of a low defect graded layer.

FIG. 18 shows a graph of the electron mobility versus temperature of a graded layer of Si:Ge such as layer 22 shown in FIG. 1. In FIG. 18, the ordinate represents mobility in $cm^2$ per volt-second and the abscissa represents temperature in degrees Kelvin. As the temperature decreases, the mobility increases, as shown by curve 142 drawn through data points 143–146. Layer 22 was strain relieved but highly perfect. Layer 22 was a Si:Ge alloy with 30 percent germanium and demonstrated bulk mobilities well in excess of any previously reported values, an example being an electron mobility of 1800 $cm^2$/V-sec at 273° Kelvin shown on curve 142 in FIG. 18. Further, layer 22 being highly perfect or without defects, has a reduced hole mass due to its germanium-like nature and layer 22 is thermally stable.

A further feature of the invention is to grow pure silicon on the top surface of a composition of Si:Ge which would be under high tension since it has a lesser lattice spacing than the composition of Si:Ge. The growth of pure silicon layers under high tension with low defects makes it feasible to build high electron mobility devices. Since the silicon layer is under high tension, the conduction band of silicon lies below the conduction band of Si:Ge, creating the correct discontinuity for a high electron mobility device.

Further, by utilizing layers of Si:Ge, integrated optics are also made feasible, given that the layers can be made with defect-free materials, yet of arbitrary band-width between that of silicon and germanium. The materials can be tai-lored to produce high optical absorbance, yet be of high enough perfection that carrier trapping and release from defects will not limit the response frequency of an optical detector based upon these materials.

Further, of great importance is the thermal stability of these low defect layers. Layers capped with a 4000 Å layer of greater than 20 percent germanium content and silicon were annealed for two hours at 900° Celsius, yet remained free of defects. This extreme thermal stability is more than adequate to allow the use of conventional device fabrication methods employing such films, and insures that the layers are indeed relaxed.

Figure 19:
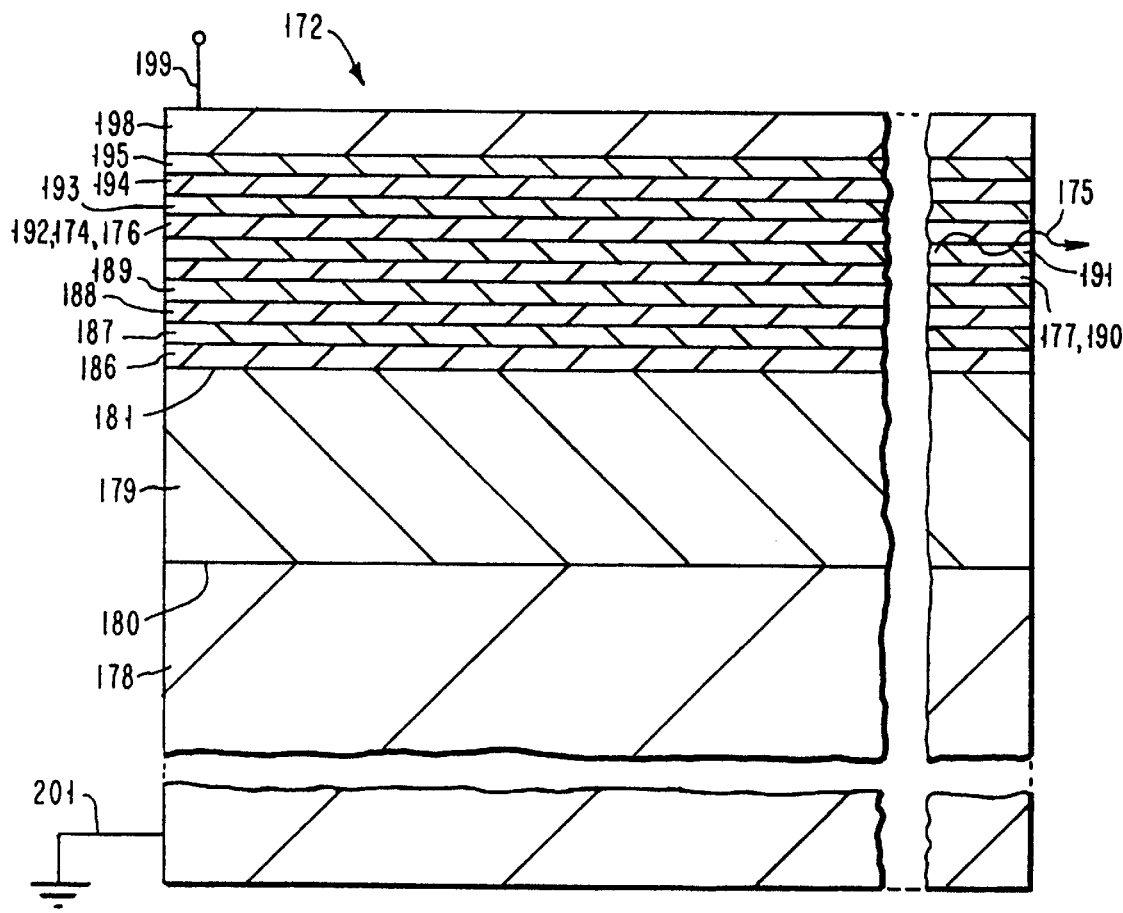
FIG. 19 is a fifth alternate embodiment of the invention.

Referring to FIG. 19, a semiconductor laser 172 is shown. Laser 172 comprises a semiconductor laser medium 174 for generating coherent radiation shown by arrow 175. Semiconductor laser medium 174 has endfaces 176 and 177. Endface 176 may be polished and totally reflecting while endface 177 may be polished and partially reflecting to allow radiation to pass from the resonant cavity formed between endfaces 176 and 177. In FIG. 19 a single crystal substrate 178 which may be, for example, silicon has a first set of lattice parameters characteristic of the substrate material. A first layer 179 has a graded composition to provide a changing lattice parameter from one of said first set of lattice parameters to a second lattice parameter on the upper surface 181 of layer 179. The change in lattice parameter in layer 179 is in the range of about 0.025 to about 2% per 1000 Å of thickness. First layer 179 is formed on the upper surface 180 of substrate 178. Layer 179 may have a graded composition of silicon and germanium wherein the composition at the upper surface 181 is 60 percent germanium and 40 percent silicon.

A second plurality of atomically thin layers 186–195 form the semiconductor laser medium 174. Layer 186 is formed on upper surface 181 of layer 179. The thicknesses of thin layers 186–195 are selected to provide a combined composition of the first and second elements, for example silicon and germanium, to generate a structure where one of its lattice constants corresponds to a predetermined third lattice parameter, the third lattice parameter being within 1 percent of the second lattice parameter which is the lattice parameter of layer 179 at upper surface 181. Several of the layers 186–195 are less than 10 atoms thick whereby zone folding of the bandgap occurs to provide a direct bandgap laser medium. The total number of atomically thin layers 186 through 195 may be in a range from about 10 to about 1000 layers. The alternating composition from the first element to the second element, for example silicon to germanium, may correspond to in atomic layer thickness of the first element to the second element in a ratio selected from the group consisting of 6/4, 5/5, 4/6, 2/8, 8/2, 7/3 and 3/7. For example, the alternating layers may be 6 atoms thick of silicon, followed by 4 atoms thick of germanium and repeating through a number of layers. The layers are selected to be atomically thin, for example less than 10 atoms thick, to provide zone folding of the bandgap.

A layer 198 of conductive material may be formed over thin layer 195. Layer 198 may be coupled over lead 199 to a voltage potential V which may supply a predetermined amount of current to conductor 198 and through laser medium 174 to substrate 178. Substrate 178 may be coupled to ground potential by way of lead 201. The current passing through laser medium 174 pumps the laser medium to provide a population inversion resulting in laser action.

Figure 20:
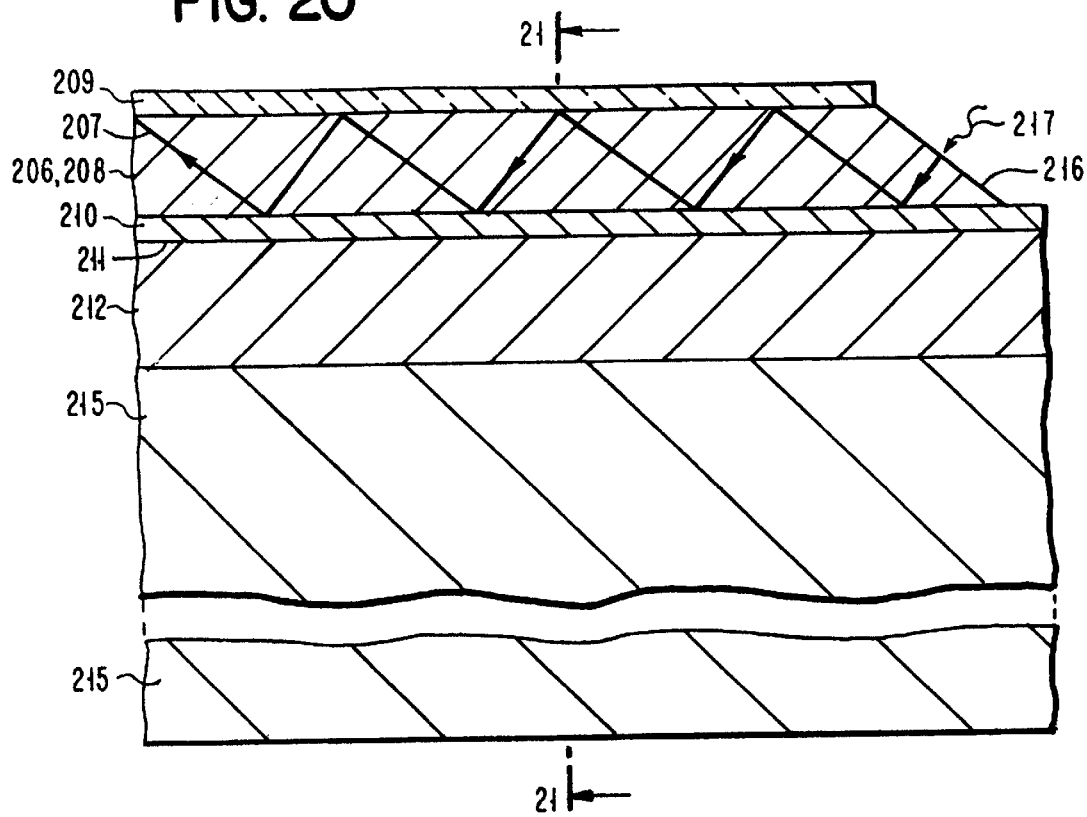
FIG. 20 is a sixth alternate embodiment of the invention.
Figure 21:
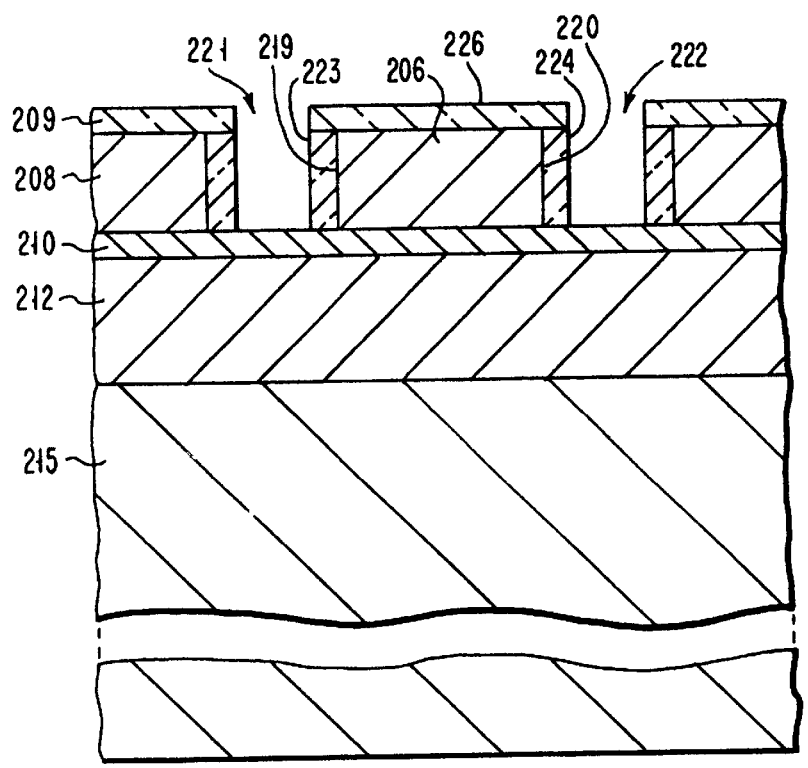
FIG. 21 is a cross-sectional view along the lines 21—21 of FIG. 20.

FIG. 20 shows a waveguide 206 for carrying radiant energy shown by arrow 207 along a layer 208 which may have a selected composition of silicon and germanium of the form $Si_x Ge_{1-x}$. Above layer 208 is a layer 209 of material having a different index of refraction to reflect radiant energy back into layer 208. Layer 209 may be composed of silicon or silicon oxide or germanium. Below layer 208 is layer 210 which may be, for example, silicon having a thickness of a range from 30 to 100 Å. Below layer 210 is layer 212 which may have a graded composition to provide a top surface having a predetermined percentage of germanium and a bottom surface of 100 percent silicon. The composition in layer 212 is selected to vary the lattice parameter in the range of about 0.025 to 2 percent per 1000 Å of thickness whereby dislocations in the layer form and migrate to the edge of the layer to relieve strain. Below layer 212 is substrate 215 which may be, for example, single crystal silicon. Layers 212, 210 and 208 are epitaxial. Layer 208 is lattice-matched to the upper surface 211 of layer 212. The upper surface of layer 212 is fully relaxed and therefore incommensurate with respect to silicon substrate 215. Radiant energy may be introduced into layer 208 by an exposed endface 216 with radiant energy shown by arrow 217 impinging thereon. Radiant energy in layer 208 may be detected by a PIN detector 25 shown in FIG. 1. Lateral sidewalls 219, 220, shown in FIG. 21, may be formed for waveguide 206 by forming trenches 221 and 222 on either side of waveguide 206, through layer 208, followed by coating or oxidizing the exposed sidewalls 219 and 220 of layer 208. This forms coatings 223 and 224 and a sheath 226 which may enclose layer 208 to reflect radiant energy therein.

In the practice of this invention it has been round that the compositionally graded layer can be changed in composition in a continuous manner, or stepwise as by depositing sequential layers of varying composition. As long as the lattice parameter of this layer changes at a rate sufficient to force the misfit dislocations to the edge of the growing layer (or to a defined island etc. therein) and to have defects move into the substrate, a low defect density layer will be obtained. In the practice of the present invention, a technique is described which modifies the nucleation of dislocations and which increases the mobility of threading segments. This can be a low temperature process (less than about 650° C.) which can be used with many different material combinations, A–B, where non lattice-matched materials A and B can be elements, alloys, or compounds. Further, the compositional grading can be in a manner to either increase the lattice constant of the graded layer or to decrease the lattice constant of the graded layer. Still further, it is possible to provide fully relaxed epitaxial layer structure in accordance with the present invention where the compositional grading of the intermediate layer stops at a particular composition for a small thickness of the intermediate layer and then changes again. That is, a fixed monotonic change in grading or a fixed repeating step-wise change in grading is not precisely necessary. Further, the graded composition layer can be doped (either in-situ or after its formation) for any purpose, including that of achieving a desired electrical property.

While the invention has been illustrated very completely in the Si-Si:Ge-GaAs system and in other systems, it should be appreciated that the concepts of this invention can be applied to many different materials combinations. For example, high $T_c$ superconducting systems are known in which superconductors such as YBa2Cu3Ox are epitaxially grown on $SrTiO_3$. If it is desired to form these materials over a silicon substrate, an intermediate layer of graded composition Si:Ge can be formed prior to the formation of the SrTFiO$_3$ layer. This will provide a better lattice match to the $SrTiO_3$ layer. In a fully relaxed state, the superconductor layer will have a very low dislocation defect density.

As another example, epitaxial metal silicides (such as transition metal and refractory metal silicides) can be formed on silicon using graded composition layers of Si:Ge between the metal silicide and the silicon substrate. For instance, the substrate can be Si and the intermediate layer a graded composition of Si:Ge with increasing Ge content to provide an upper surface region of the Si:Ge layer which has a better lattice match to a metal silicide, such as Ni or Co silicide. After formation of the metal silicide, it is also possible to deposit another Si:Ge layer of varying composition after which a Si layer can be epitaxially deposited. This will form a 3D structure including silicon layers useful for device formation separated by buried metal silicide conductors.

Another example is that of an insulating material which can be more appropriately lattice-matched to a silicon layer by the use of an intermediate graded composition layer. On a silicon substrate a Si:Ge layer of varying Ge content is formed in order to provide an uppermost layer having a lattice match which closely approximates $CaF_2$. Deposition of the $CaF_2$ layer will provide a structure which can be fully relaxed and of low defect density to allow the formation of another Si:Ge layer of varying composition than another Si layer thereover. Thus, a 3D structure will be provided wherein high quality silicon layers are provided which are separated by insulating layers of $CaF_2$.

As further examples of the different types of materials that can be combined in accordance with the present invention, the substrate can be GaAs. On this is formed a GaAs layer including In where the In content increases as the layer thickness increases until the final surface region of the intermediate layer is InAs. This InAs composition can be increased in thickness and used as either a device layer or as a substrate layer for the later deposition of an In-based layer (such as those used for long wavelength diode lasers).

Another alternative structure which illustrates the utility of the present invention uses as a substrate a GaAs-based layer. On this is deposited a pure Ge layer lattice-matched to the substrate, after which Si is added to compositionally grade the intermediate Si:Ge layer until eventually it is pure Si. On this can be deposited an epitaxial Si layer, or another layer having a good epitaxial match to Si. This additional Si layer can be used for the formation of devices therein to thereby integrate GaAs devices and Si devices.

As another example, this invention can be utilized with II–VI semi-conductors such as CdTe, CdS, ZnS, ZnSe, and materials which are not lattice-matched with these II–VI semi-conductors. For example, the substrate can be CdTe and the intermediate layer or varying composition, $Hg_x, Cd_y, Te_z$, can have increasing Hg content from an amount of zero at the interface with the substrate to an amount of Hg necessary to yield the desired lattice constant for a match to another layer (such as HgTe) to be epitaxially deposited on the intermediate layer.

Accordingly, it is apparent that the technique of the present invention can be used to provide structures including non lattice-matched materials whereby fully relaxed, incommensurate structure can be formed which exhibit low defect densities. The rate of change of the compositional grading is chosen such that the glide distance of misfit dislocations is greater than the dimension of interest so that complete migration to the edges of the intermediate layer (or to other specified regions) will occur and so that defects will be formed in the substrate. This means that the uppermost layer of the intermediate layer will be substantially defect-free so that this uppermost layer can be used for device formation or as a substrate for a subsequently deposited epitaxial layer. Because the structure is fully relaxed, it is thermally stable and therefore suitable for further processing.

This invention is particularly useful when the diameter of the substrates is quite large, for example in excess of three inches. In the practice of this invention, it is desired to increase the mobility of threading segments to have the average glide distance of the misfit dislocations be several orders of magnitude in excess of the dimensions of interest, e.g., in excess of the diameter of the crystalline substrate. These glide distances cannot be achieved in the prior art without greatly increased temperatures, and even then have a maximum in the order of several tens or hundreds of microns. In the practice of the present invention, the glide distance can be increased to be able to accommodate substrates of large diameter, such as 6–8 inches. Thus, the technique is particularly well suited for use with conventionally known semi-conductor systems.

While the invention has been described with respect to particular embodiments thereof, it will be apparent to those of skill in the art that variations can be made therein without departing from the spirit and scope of the invention. For example, others may envision materials combinations in addition to those specifically mentioned, epitaxial layering processes in addition to UHVCVD and MBE, and device structure such as resonant tunneling devices, other than those illustrated as examples.

We claim:

1. A method for forming an incommensurate crystalline film of arbitrary lattice spacing above crystalline layers comprising the steps of:

selecting a first substrate of single crystalline material having a first set of lattice parameters and a clean upper surface, first forming a plurality of epitaxial layers on said clean upper surface, said step of first forming including the step of varying the composition of a number of said plurality of epitaxial layers to change one or more lattice parameters of said number of said plurality of epitaxial layers less than 2 percent per 1000 Å of thickness whereby misfit dislocations in said selected layers migrate to the respective edges of said number of said plurality of epitaxial layers during said step of first forming thereby forming said incommensurate crystalline film above said number of said plurality of layers, said step of first forming including the step of forming at a temperature less than about 650° C.

2. The method of claim 1 wherein said step of first forming includes the step of second forming one of said epitaxial layers by ultra high vacuum chemical vapor deposition at a pressure less than $10^{-8}$ Torr.

3. A process for forming a structure including relaxed incommensurate layers including a final epitaxial layer of low crystallographic defect density, comprising the following steps:

depositing on a single crystalline substrate a first epitaxial layer of graded composition where said composition is graded at a rate of less than 2 percent per 1000 Å thickness whereby misfit dislocations formed in said first epitaxial layer migrate to the edges of this layer as it is formed to provide a top surface layer of said first epitaxial layer having crystallographic defects therein of less than about $10^5/cm^2$, said first epitaxial layer being formed at a temperature less than about 650° C., continuing the growth of said first epitaxial layer at a substantially constant composition, and forming a second epitaxial layer on said first epitaxial layer, said second epitaxial layer being of adequate thickness to ensure relaxation of said second epitaxial layer to an equilibrium, strain-free lattice constant substantially matched to the lattice constant of said top surface layer of essentially constant composition of said first epitaxial layer.

4. The process of claim 3, where said second epitaxial layer has a density of crystallographic defects therein less than about $10^5/cm^2$.

5. The process of claim 3, where said substrate is a semiconductor material.

6. The process of claim 3, including the further step of forming a device in said second epitaxial layer.

7. The process of claim 3, including the further step of forming a device in the said substantially constant composition of said first epitaxial layer.

8. The process of claim 3, wherein said steps are repeated to produce a three dimensional structure including multiple epitaxial layers of graded composition separating epitaxial layers which are non lattice matched with one another.

9. The process of claim 3, wherein said substrate is silicon, said first epitaxial layer of graded composition is primarily comprised of Si:Ge, and said second epitaxial layer is a GaAs-based layer.

10. The process of claim 3, in which said second epitaxial layer exhibits superconductivity.

11. The process of claim 3, wherein said second epitaxial layer has metallic conductivity properties.

12. The process of claim 3, where said second epitaxial layer is an insulator.

13. The process of claim 3, wherein said substrate has a diameter at least about three inches.

14. The process of claim 3, wherein said first and second epitaxial layers are formed at temperatures less than about 650° C.

15. A method for producing a structure including a crystalline substrate and an epitaxial layer thereover including the steps of:

providing a crystalline substrate, having a first lattice parameter, forming a first epitaxial layer thereon of graded lattice parameter, said first epitaxial layer having a lattice parameter substantially the same as that of said substrate at the interface of said epitaxial layer and said substrate, said lattice parameter being graded less than 2 percent per 1000 Å thickness of said first epitaxial layer to produce a surface region thereof having a second lattice parameter, whereby pinning of threading dislocations in said first epitaxial layer is reduced to provide a top surface having a density of crystallographic defects of less than about $10^5/cm^2$, said step of forming including the step of forming at a temperature less than about 650° C.

16. The method of claim 15 including the further step of forming a second epitaxial layer on said first epitaxial layer, said first and second epitaxial layers having substantially matched lattice parameters.

17. The method of claim 15, where said surface region of said first epitaxial layer is relaxed.

18. The method of claim 1 wherein said step of first forming includes changing one or more lattice parameters in the range from about 1 percent to 2 percent per 1000 Å.

19. The method of claim 3 wherein said step of depositing includes changing one or more lattice parameters at a rate in the range from about 1 percent to 2 percent per 1000 Å.

20. The method of claim 15 wherein said step of forming includes said lattice parameter graded in the range from about 1 percent to 2 percent per 1000 Å.

* * * * *